(12) United States Patent
Ikeda et al.

(10) Patent No.: US 11,538,667 B2
(45) Date of Patent: Dec. 27, 2022

(54) STAGE, PLASMA PROCESSING APPARATUS, AND PLASMA PROCESSING METHOD

(71) Applicant: Tokyo Electron Limited, Tokyo (JP)

(72) Inventors: Taro Ikeda, Yamanashi (JP); Satoru Kawakami, Yamanashi (JP); Sumi Tanaka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/175,782

(22) Filed: Feb. 15, 2021

(65) Prior Publication Data

US 2021/0265138 A1    Aug. 26, 2021

(30) Foreign Application Priority Data

Feb. 20, 2020  (JP) .............................. JP2020-027271

(51) Int. Cl.
   *H01J 37/32*   (2006.01)
(52) U.S. Cl.
   CPC .. *H01J 37/32568* (2013.01); *H01J 37/32082* (2013.01); *H01J 37/32449* (2013.01); *H01J 37/32541* (2013.01); *H01J 2237/334* (2013.01)

(58) Field of Classification Search
   CPC .......... H01J 37/32568; H01J 37/32082; H01J 37/32449; H01J 37/32541; H01J 2237/334
   See application file for complete search history.

(56) References Cited

U.S. PATENT DOCUMENTS

| | | | |
|---|---|---|---|
| 6,441,553 B1 * | 8/2002 | Yializis | H01J 37/32009 |
| | | | 219/121.36 |
| 2015/0279632 A1 * | 10/2015 | Lin | H01J 37/32715 |
| | | | 438/798 |
| 2020/0111640 A1 * | 4/2020 | Shim | H01J 37/32715 |
| 2020/0161106 A1 * | 5/2020 | Takahashi | H01J 37/32541 |

FOREIGN PATENT DOCUMENTS

| | | |
|---|---|---|
| JP | 2010-531538 A | 9/2010 |
| JP | WO2019/102794 A | 5/2019 |
| KR | 10-2019-0129722 A | 11/2019 |

* cited by examiner

*Primary Examiner* — Henry Luong
(74) *Attorney, Agent, or Firm* — Venjuris, P.C.

(57) ABSTRACT

A stage includes a stage body having a placement surface and a radio-frequency electrode embedded in the stage body. The stage body is made of ceramics, and the radio-frequency electrode extends in a thickness direction of the stage body in a region below an outer periphery of the placement surface.

16 Claims, 7 Drawing Sheets

STAGE, PLASMA PROCESSING APPARATUS, AND PLASMA PROCESSING METHOD

CROSS-REFERENCE TO RELATED APPLICATIONS

The present application is based on and claims priority from Japanese Patent Application No. 2020-027271, filed on Feb. 20, 2020, with the Japan Patent Office, the disclosure of which is incorporated herein in its entirety by reference.

TECHNICAL FIELD

The present disclosure relates to a stage, a plasma processing apparatus, and a plasma processing method.

BACKGROUND

Japanese Laid-Open Patent Publication No. 2010-531538 discloses a technique for processing the edge of a substrate with plasma and etching the substrate.

SUMMARY

According to an aspect of the present disclosure, a stage having a placement surface is provided. The stage has a thickness, and includes a stage body in which a radio-frequency electrode is embedded. The stage body is made of ceramics, and the radio-frequency electrode extends in a direction of the thickness in a region below an outer periphery of the placement surface.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF THE DRAWINGS

Figure 1:
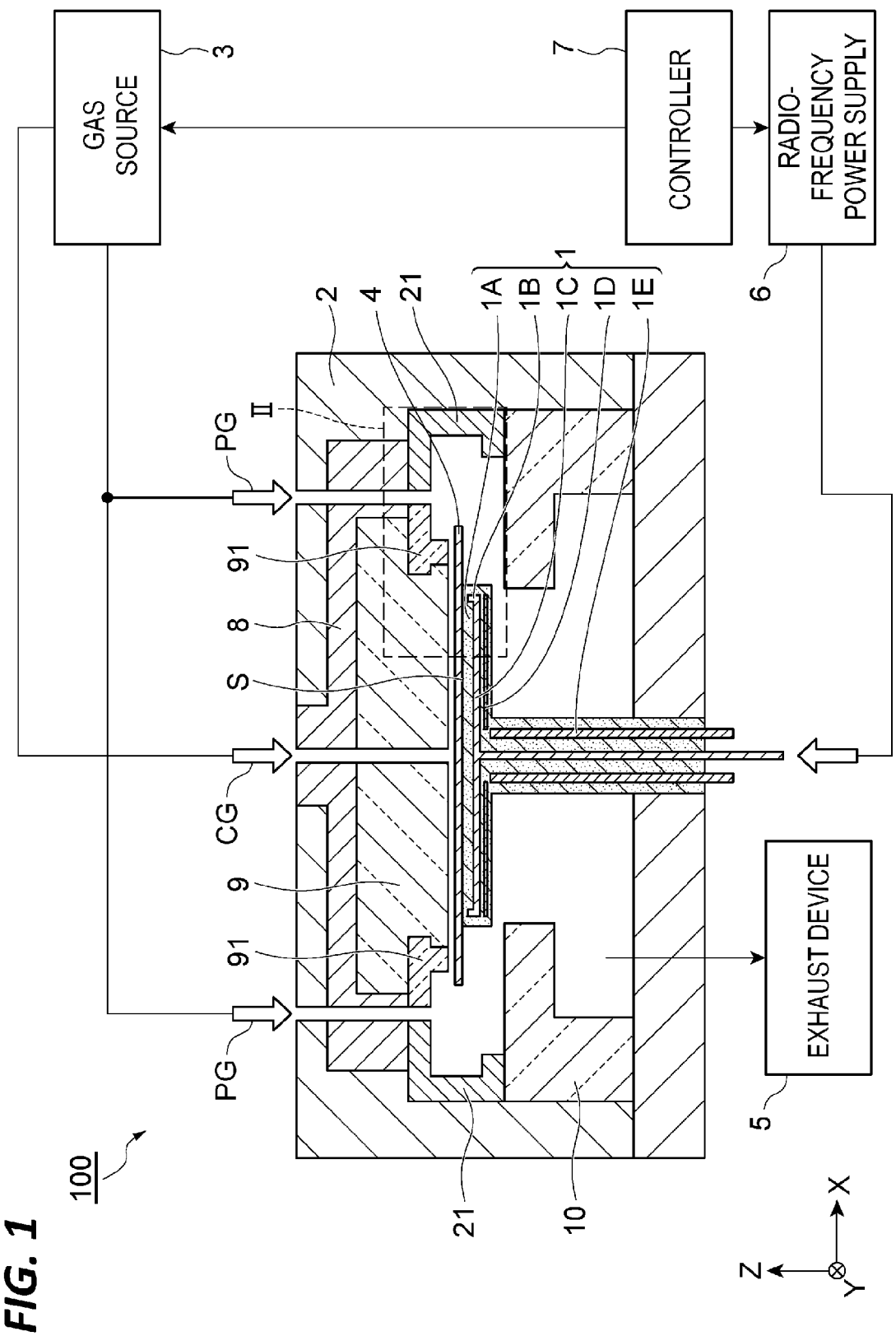
FIG. 1 is a view illustrating a vertical cross-sectional configuration of a plasma processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In an embodiment, a stage having a placement surface is provided. The stage a thickness, and includes a stage body in which a radio-frequency electrode is embedded. The stage body is made of ceramics, and the radio-frequency electrode extends in the direction of the thickness in a region below the outer periphery of the placement surface.

A substrate is placed on the placement surface of the stage. The ceramics is an insulating inorganic solid material, and the radio-frequency electrode is embedded in the stage body made of the ceramics. The radio-frequency electrode extends in the direction of the thickness in the region below the outer periphery of the placement surface. In other words, the radio-frequency electrode has a vertically protruding shape.

An outer electrode may be disposed outside the periphery of the substrate. When a radio-frequency voltage is applied between the radio-frequency electrode disposed in the region below the outer periphery of the placement surface and the outer electrode, plasma is easily generated near the peripheral edge of the substrate so that plasma may be efficiently generated. When plasma is generated under a gas atmosphere suitable for an etching, deposits that adhere to the edge of the substrate may be efficiently etched. Since the radio-frequency electrode is embedded in the ceramics, the radio-frequency electrode is protected without being exposed to the plasma.

In an embodiment, a plurality of transmission lines is further provided to be connected from a substantially central position of the stage to the radio-frequency electrode. Each transmission line is a thin film having a width W, and the width W satisfies 0.5 mm≤W≤5 mm.

The radio-frequency electrode disposed in the region below the outer periphery of the placement surface contributes to the generation of plasma near the edge of the substrate, and the transmission lines supply a radio frequency to the radio-frequency electrode. The center of gravity in the planar shape of the stage is defined as the center of the stage. The substantially central position of the stage refers to a position within a region from the center of the stage to 10% or less of the maximum diameter of the stage. When the width W is smaller than the lower limit value, the resistance value largely increases, and a power loss occurs. When the width W is larger than the upper limit value, plasma may be widely generated by an electric field generated above the transmission lines. In order to selectively generate plasma only near the edge of the substrate, the generation of plasma above the transmission lines may not be preferable. When 0.5 mm≤W≤5 mm is satisfied, this problem is suppressed, and plasma may be selectively generated near the edge of the substrate.

In an embodiment, the maximum diameter of the placement surface is smaller than the maximum diameter of the substrate placed on the placement surface. In the plasma processing apparatus, the dimension of the substrate to be processed is preset by an apparatus specification. For example, when an 8-inch wafer (a diameter of 20 cm) is processed, the maximum diameter of the substrate corresponds to the diameter of the wafer. When the maximum diameter of the placement surface is smaller than the maximum diameter of the substrate, the edge of the substrate protrudes from the placement surface, so that plasma is easily generated near the edge of the substrate.

In an embodiment, the stage body includes a heater electrode layer therein. By applying a power to the heater electrode layer, the stage may be heated.

In an embodiment, the dimension $\Delta Z$ of the radio-frequency electrode in the direction of the thickness satisfies 0.05 mm≤$\Delta Z$≤10 mm. The radio-frequency electrode extends along the direction of the thickness. When the dimension $\Delta Z$ is smaller than the lower limit value, the area that faces the outer electrode is reduced, which causes a problem that the generation of plasma near the edge of the substrate is suppressed. When the dimension $\Delta Z$ is larger than the upper limit value, the electric field tends to insufficiently concentrate on the edge of the substrate. This problem is suppressed when the dimension $\Delta Z$ satisfies the relational expression described above, so that it becomes easy to selectively generate plasma near the edge of the substrate.

In an embodiment, the distance $\Delta r$ between the region below the outer periphery of the placement surface and the peripheral edge of the placement surface satisfies 1 mm≤$\Delta r$≤5 mm.

In an embodiment, since the radio-frequency electrode is embedded and protected in the stage body, $\Delta r$ is larger than zero. When $\Delta r$ is 1 mm or more, the stage body made of ceramics is not easily scraped even though the stage body is exposed to plasma, so that the radio-frequency electrode is protected. When $\Delta r$ is 5 mm or less, the radio-frequency electrode is not excessively spaced apart from the edge of the substrate, so that plasma may be effectively generated near the edge of the substrate. Further, when $\Delta r$ is 5 mm or less, the influence of the electric field change caused from the ceramics may be suppressed to be small.

In an embodiment, the planar shape of the radio-frequency electrode includes a ring shape. In this case, plasma may be continuously generated in the ring shape. When the planar shape of the substrate is circular, plasma may be generated along the edge of the substrate.

The plasma processing apparatus according to an embodiment includes the stage described above, a processing container that accommodates the stage, and a gas source for the generation of plasma in the processing container. When a gas is supplied from the gas source into the processing container, and when a radio-frequency power is supplied to the radio-frequency electrode of the stage, plasma of the supplied gas is generated near the edge of the substrate placed on the stage. When the gas is an etching gas, deposits that adhere to the vicinity of the edge of the substrate are etched by the plasma of the etching gas. When the gas is a gas for the formation of a film, a film may be formed near the edge of the substrate.

In an embodiment, the supply positions of the gas supplied from the gas source are the center and the periphery of the processing container. When the gas is supplied from the center and the periphery of the processing container, the gas state (e.g., a gas flow or a mixing ratio of gas types) near the edge of the substrate may be more precisely controlled.

The plasma processing apparatus according to an embodiment further includes an insulating member disposed above the substrate placed on the placement surface of the stage via a gap. Since plasma is selectively generated near the edge of the substrate, the generation of plasma in the other regions of the substrate needs to be suppressed. When the insulating member is disposed above the substrate via a gap, the gas flow may be allowed within the gap, but plasma may be suppressed from being generated within the gap by appropriately setting the dimension of the gap.

In the plasma processing apparatus according to an embodiment, the gap is defined as $\Delta g$. The gap $\Delta g$ may satisfy 0.3 mm≤$\Delta g$≤0.6 mm. When the gap $\Delta g$ exceeds the upper limit value, plasma may easily be generated, and when the gap $\Delta g$ is smaller than the lower limit value, the gas flow is impeded. Accordingly, when $\Delta g$ satisfies the relational expression described above, plasma is hardly generated in regions of the substrate other than the vicinity of the edge thereof within the gap, and the gas flow becomes smooth in the gap.

In the plasma processing apparatus according to an embodiment, the radial position of the peripheral edge of the substrate placed on the placement surface of the stage is present outside the radial position of the peripheral edge of the lower end of the insulating member. Since the edge of the substrate is positioned outside the edge of the insulating member, the edge of the substrate protrudes from the insulating member. As a result, plasma may easily be generated near the edge of the substrate.

The difference $\Delta R$ between the radial position R1 of the peripheral edge of the substrate and the radial position R2 of the peripheral edge of the lower end of the insulating member satisfies 0.5 mm≤$\Delta R$≤3 mm. When the difference $\Delta R$ exceeds the upper limit value, plasma may easily be generated on the region closer to the center of the substrate than the edge of the substrate. When the difference $\Delta R$ is smaller than the lower limit value, the generation of plasma near the edge of the substrate is suppressed. Accordingly, when $\Delta R$ satisfies the relational expression described above, plasma is hardly generated in regions of the substrate other than the vicinity of the edge thereof, and may be easily selectively generated near the edge of the substrate.

The plasma processing apparatus according to an embodiment includes the stage, the processing container that accommodates the stage, and the gas source for the generation of plasma in the processing container. The stage includes the placement surface, and the stage body in which the radio-frequency electrode is embedded. The stage body is made of ceramics, and the radio-frequency electrode is disposed in the region below the outer periphery of the placement surface. The maximum diameter of the placement surface is smaller than the maximum diameter of the substrate placed on the placement surface.

The outer electrode may be disposed outside the periphery of the substrate. When a radio-frequency voltage is applied between the radio-frequency electrode disposed in the region below the outer periphery of the placement surface and the outer electrode, plasma is easily generated near the peripheral edge of the substrate. Further, when the maximum diameter of the placement surface is smaller than the maximum diameter of the substrate, the edge of the substrate protrudes from the placement surface, so that plasma may easily be generated near the edge of the substrate. When plasma is generated under a gas atmosphere suitable for an etching, deposits that adhere to the edge of the substrate may be efficiently etched. When the gas is a gas for the formation of a film, a film may be formed near the edge of the substrate. Since the radio-frequency electrode is embedded in the ceramics, the radio-frequency electrode is protected without being exposed to the plasma.

A plasma processing method according to an embodiment includes placing the substrate on the stage, and supplying a gas from the gas source into the processing container, using the plasma processing apparatus described above. Further, the plasma processing method includes supplying a radio-frequency power to the radio-frequency electrode, so as to selectively generate plasma near the peripheral edge of the substrate. Since plasma is selectively generated near the peripheral edge of the substrate 4, the edge of the substrate may be efficiently processed with the plasma without causing the other portions of the substrate to be exposed to the plasma.

Hereinafter, various embodiments will be described with reference to the accompanying drawings. In the respective drawings, similar or corresponding portions will be denoted by the same reference numerals, and overlapping descriptions thereof will be omitted.

FIG. 1 is a view illustrating a vertical cross-sectional configuration of a plasma processing apparatus according to an embodiment. As illustrated in FIG. 1, an XYZ three-dimension orthogonal coordinate system is set in which the Z axis is the vertical direction, and the XY plane is the horizontal plane.

A plasma processing apparatus 100 includes a stage 1, a processing container 2 that accommodates the stage 1, and a gas source 3 for the generation of plasma in the processing container 2. When a gas is supplied from the gas source 3 into the processing container, and when a radio-frequency power is supplied to a radio-frequency electrode 1B of the stage 1, plasma of the supplied gas is generated concentrating on the vicinity of the edge of a substrate 4 placed on the stage 1. The "vicinity" indicates a region where the horizontal spacing distance from the edge of the substrate is equal to or less than the thickness of the substrate 4. When the gas is an etching gas, deposits that adhere to the vicinity of the edge of the substrate 4 are etched by plasma of the etching gas. When the supplied gas is a gas for the formation of a film, a film is formed near the edge of the substrate.

The flowable chemical vapor deposition (FCVD) method forms a CVD film, by generating plasma with a relatively low power (e.g., 900 W, 800 W, 700 W, 600 W or 500 W or lower). The raw-material gas has a fluidity by being liquefied, and is supplied to a substrate with a relatively low temperature. An embedding film formation is performed in holes or trenches in a state where the supplied raw material has a fluidity. When a film that contains a material such as $SiO_2$ is formed, plasma may be generated using the film component as the raw material gas. When an $SiO_2$ film is formed, silane ($SiH_4$) gas and oxygen ($O_2$) gas may be supplied from the gas source 3 into the processing container 2. When the FCVD method is used, unintended deposits ($SiO_2$) may adhere to the peripheral edge of the substrate 4. In order to clean and remove the deposits, plasma may be selectively generated only near the edge of the substrate such that only the vicinity of the edge of the substrate may be etched. The stage 1, the plasma processing apparatus 100, and the plasma processing method according to the present embodiment are useful for selectively generating plasma generated only near the edge of the substrate. Especially, the present embodiment is useful for removing deposits that adhere to the edge of the substrate according to the FCVD method or the like.

For a physical etching, the etching gas supplied from the gas source 3 may be a rare gas such as argon (Ar) or a reactive etching gas [CF-based gas (e.g., $CF_4$)]. The type of etching gas is not limited thereto, and various etching gases that are known in the related art may be used.

The plasma processing apparatus 100 includes an exhaust device 5 that exhausts a gas in the processing container 2, a radio-frequency power supply 6 that supplies a radio-frequency power to the radio-frequency electrode 1B, and a controller 7. The controller 7 is a computer that controls the gas source 3 provided with a gas flow rate controller, the exhaust device 5, and the radio-frequency power supply 6.

The computer includes a central processing unit (CPU) and a storage device in which various control programs are stored. In the present embodiment, each operation such as supplying a gas, exhausting a gas, applying a radio-frequency voltage, and heating a heater is performed according to the control programs.

The stage 1 includes a stage body 1A, the radio-frequency electrode 1B, transmission lines 1C, a heater electrode layer 1D, and a tubular outer conductor 1E. The stage 1 includes a placement surface S for a substrate, and has a thickness along the Z-axis direction.

The stage body 1A is made of a material including ceramics. The ceramics is an insulating inorganic solid material, and is formed by sintering raw material powder. As the ceramics, a sintered body having an insulating property is generally known. As the ceramic material, alumina ($Al_2O_3$), aluminum nitride (AlN), zirconia ($ZrO_2$), silicon carbide (SiC), silicon nitride ($Si_3N_4$) or the like is known. In the present example, the ceramic material is AlN.

The radio-frequency electrode 1B extends in the direction of the thickness (the Z-axis direction) in the region below the outer periphery of the placement surface S of the stage 1. In other words, the radio-frequency electrode 1B has a shape that protrudes vertically upward. The placement surface S is parallel to the XY plane.

The radio-frequency electrode 1B is made of a conductor material. As the conductor material, not only gold (Au), silver (Ag), copper (Cu), and aluminum (Al) but also high melting point metals such as tungsten (W), tantalum (Ta), and molybdenum (Mo) are known. The stage 1 is heated by the heater electrode layer 1D as necessary. Since the edge of the substrate 4 becomes hot by plasma, the radio-frequency electrode 1B may be made of a conductor material having a heat resistance to the generated plasma. In the present example, the radio-frequency electrode 1B is made of tungsten (W) which is a high melting point metal.

The transmission lines 1C may be made of the same material as that of the radio-frequency electrode 1B. That is, the radio-frequency electrode 1B and the transmission lines 1C may be integrated with each other, or may be made of different materials. The transmission lines 1C may be made of a highly conductive material in order to suppress a power loss, and is made of, for example, copper (Cu). The transmission lines 1C are embedded in the stage body 1A, and connected to the radio-frequency electrode 1B. Since an AC power is supplied to the transmission lines 1C, the transmission lines 1C and the radio-frequency electrode 1B may be electrically connected to each other such that the AC current flows through the transmission lines 1C and the radio-frequency electrode 1B. That is, the transmission lines 1C and the radio-frequency electrode 1B may not necessarily be configured to be physically continuous to each other. The transmission lines 1C include a plurality of horizontal wirings 1C(H) that extends horizontally, and an inner conductor 1C(V) that extends vertically from the center of the stage 1 along the center of a support shaft of the stage 1. The inner conductor 1C(V) is disposed inside the tubular outer conductor 1E.

The heater electrode layer 1D is provided inside the stage body 1A. The stage 1 may be heated by supplying a power to the heater electrode layer 1D. The heater electrode layer 1D is disposed below the radio-frequency electrode 1B, or may be provided above the radio-frequency electrode 1B. That is, when the heater electrode layer 1D is provided above the radio-frequency electrode 1B or the transmission lines 1C, the heater electrode layer 1D may function as a radio-frequency shielding layer. When the heater electrode layer 1D shields the radio frequency that arrives on the substrate 4, it may be expected to suppress plasma on the surface of the substrate 4 even though the first insulating member 9 is omitted. Further, in this case, it may be conceived to form the transmission lines 1C that make up the horizontal wirings, in a shape having no gaps.

The heater electrode layer 1D is made of a high resistance material, and is a heating element heated when a power is supplied. As the resistance heating material, for example, Ni—Cr-based alloy, Fe—Cr—Al-based alloy, the high melting point metal described above, high melting point silicide, silicon carbide (SiC), and graphite are known. From the viewpoint of the heat resistance, for example, $MoSi_2$ which is high melting point metal silicide may be used.

The outer conductor 1E is, for example, a tubular conductor, and may be made of a highly conductive material in order to suppress a power loss. For example, the outer conductor 1E may be made of, for example, copper (Cu), or may be made of the same material as that of the inner conductor (the transmission lines 1C). The outer conductor 1E also functions as an electromagnetic shield for the inner conductor. As the materials of the radio-frequency electrode 1B, the transmission lines 1C, and the outer conductor 1E, a material containing at least one metal selected from the conductor materials described above may be used.

An upper electrode 8 is disposed outside the periphery of the substrate 4. The upper electrode 8 is made of a conductor material such as gold (Au), silver (Ag), copper (Cu) or aluminum (Al). In the present example, the upper electrode 8 is made of aluminum (Al). The processing container 2 includes a bottom plate made of a metal and an upper cover made of a metal and provided on the bottom plate, and provides a closed space between the bottom plate and the upper cover. In the present example, the material of the upper cover that configures the upper portion of the processing container 2 is aluminum. The upper electrode 8 and the upper cover of the processing container 2 may be integrated with each other.

An exhaust ring 21 (the outer electrode) is provided outside the stage 1 in the horizontal direction, below the upper electrode 8. The exhaust ring 21 is a conductor having an annular shape in the planar view from the Z-axis direction, and has a shape in which a shape recessed radially (horizontally) from the center of the stage 1 is continuous along the circumferential direction of the ring. A region where a gas may exist is formed inside the recessed shape. By providing an exhaust hole in the exhaust ring 21 and connecting the exhaust device 5 thereto, the gas inside the processing container 2 may be exhausted to the outside. As the structure for exhausting the gas inside the processing container 2, a structure that does not use the exhaust ring 21 may be adopted. The exhaust ring 21 (the outer electrode) contributes to forming an electric field between the radio-frequency electrode 1B of the stage 1 and the exhaust ring 21. The structure of the conductor usable for forming the electric field is not limited to the exhaust ring 21, and a conductor having the same structure as that of the exhaust ring 21 may be used. Further, plasma is not generated near the exhaust ring 21, and the exhaust ring 21 is spaced apart from the edge of the substrate 4 by a certain distance.

The potentials of the upper electrode 8, the processing container 2, and the exhaust ring 21 are fixed to the ground potential, like the potential of the tubular outer conductor 1E. The potential of the radio-frequency electrode 1B fluctuates by the supply of a radio-frequency power from the radio-frequency power supply 6, and a radio-frequency voltage is applied between the radio-frequency electrode 1B and the exhaust ring 21. When the radio-frequency voltage is applied, an electric field is formed in the space where the radio-frequency electrode 1B and the exhaust ring 21 are connected to each other, and the edge of the substrate 4 is positioned within the electric field. Since the edge of the substrate 4 has the horizontally protruding shape, the electric field concentrates on the peripheral edge of the substrate 4, and plasma is easily generated near the edge of the substrate 4. That is, plasma may be efficiently generated near the edge of the substrate.

When plasma is generated under a gas atmosphere suitable for an etching, deposits that adhere to the edge of the substrate 4 may be efficiently etched. Since the radio-frequency electrode 1B is embedded in the ceramics, the radio-frequency electrode 1B is protected without being exposed to the plasma.

The supply positions of the gas supplied from the gas source 3 are the center and the periphery of the processing container 2. A first gas CG for the supply from the center of the processing container 2 and a second gas PG for the supply from the periphery of the processing container 2 are supplied from the gas source 3 into the processing container 2. The types of the first gas CG and the second gas PG may be the same or different from each other. The gas source 3 includes a flow rate controller, and the controller 7 may control the flow rate controller so as to control the flow rate of the gas supplied into the processing container 2. By supplying the gas from the center and the periphery of the processing container 2, the gas state (e.g., a gas flow or a mixing ratio of gas types) near the edge of the substrate 4 may be more precisely controlled.

For example, X gas is supplied as the first gas CG from the gas source 3 to the center of the processing container 2, and Y gas is supplied as the second gas PG from the gas source 3 to the periphery of the processing container 2. Examples of the X gas include fluorocarbon ($CF_4$), and examples of the Y gas include oxygen ($O_2$). These gases are mixed with each other to become an etching gas for $SiO_2$, near the edge of the substrate 4. The first gas CG may contain the X gas and the Y gas, and the second gas PG may also contain the X gas and the Y gas, such that only the mixing ratio of the gases may be changed. As a carrier gas, a rare gas such as Ar may be included. Hydrogen ($H_2$) gas, nitrogen ($N_2$) gas or other gases required for an etching may be used as necessary.

The plasma processing apparatus 100 includes a first insulating member 9 disposed above the stage 1. The first insulating member 9 is a substantially columnar block, and is disposed apart from the placement surface S of the stage 1. Since the substrate 4 is placed on the placement surface S of the stage 1, the first insulating member 9 is also spaced apart from the exposed surface of the substrate 4. The first gas CG is supplied from the gas source 3 into the processing container 2 through a through hole provided at the center of the first insulating member 9. The first gas CG flows from the lower end of the through hole of the first insulating member 9 toward the surface of the substrate 4, collides with the central surface of the substrate 4, and then, flows radially toward the edge of the substrate on the surface of the substrate.

The first insulating member 9 is disposed above the substrate 4 placed on the placement surface S of the stage 1 via a gap. Since plasma is selectively generated near the edge of the substrate 4, the generation of plasma in the other regions of the substrate 4 needs to be suppressed. When the first insulating member 9 is disposed above the substrate 4 via a gap, the gas flow is allowed within the gap, but plasma may be suppressed from being generated within the gap by appropriately setting the dimension of the gap. That is, when the gap is relatively small, the generation of plasma within the gap is suppressed.

The first insulating member 9 may be configured by a single member, or may be configured by a plurality of members. A replaceable ring component 91 is provided at the lower end of the outer periphery of the first insulating member 9. In the present example, the first insulating member 9 (the main body) and the ring component 91 are made of the same insulating material, and make up an insulating member together. The material of the insulating member is specifically quartz. When the same material is used, there is an advantage in that a deformation or the like is reduced, because the thermal expansion coefficients are the same. The edge of the substrate 4 is positioned at the region directly below the outer periphery of the insulating member, and plasma is generated at the position of the edge. Accordingly, the ring component 91 is affected by the plasma, and may deteriorate when the ring component 91 is used for a long time. Thus, the ring component 91 is replaceable, and the first insulating member 9 that is the main body may not be entirely replaced.

The plasma processing apparatus 100 includes a second insulating member 10 disposed below the placement surface S of the stage 1. The second insulating member 10 is a substantially annular block, and is disposed below the outer periphery of the substrate 4. Specifically, the edge of the substrate 4 is disposed between the first insulating member 9 (the ring component 91) and the second insulating member 10, the exhaust ring 21 is disposed beside the edge of the substrate 4, and the stage 1 is disposed below the center of the substrate 4. In summary, the edge of the substrate 4 is disposed in the space surrounded by the first insulating member 9, the second insulating member 10, and the exhaust ring 21, so that the electric field concentrates on the edge of the substrate, and plasma is easily generated. Further, the second insulating member 10 suppresses the generation of plasma in the space between the bottom surface of the processing container 2 and the edge of the substrate 4.

Figure 2:
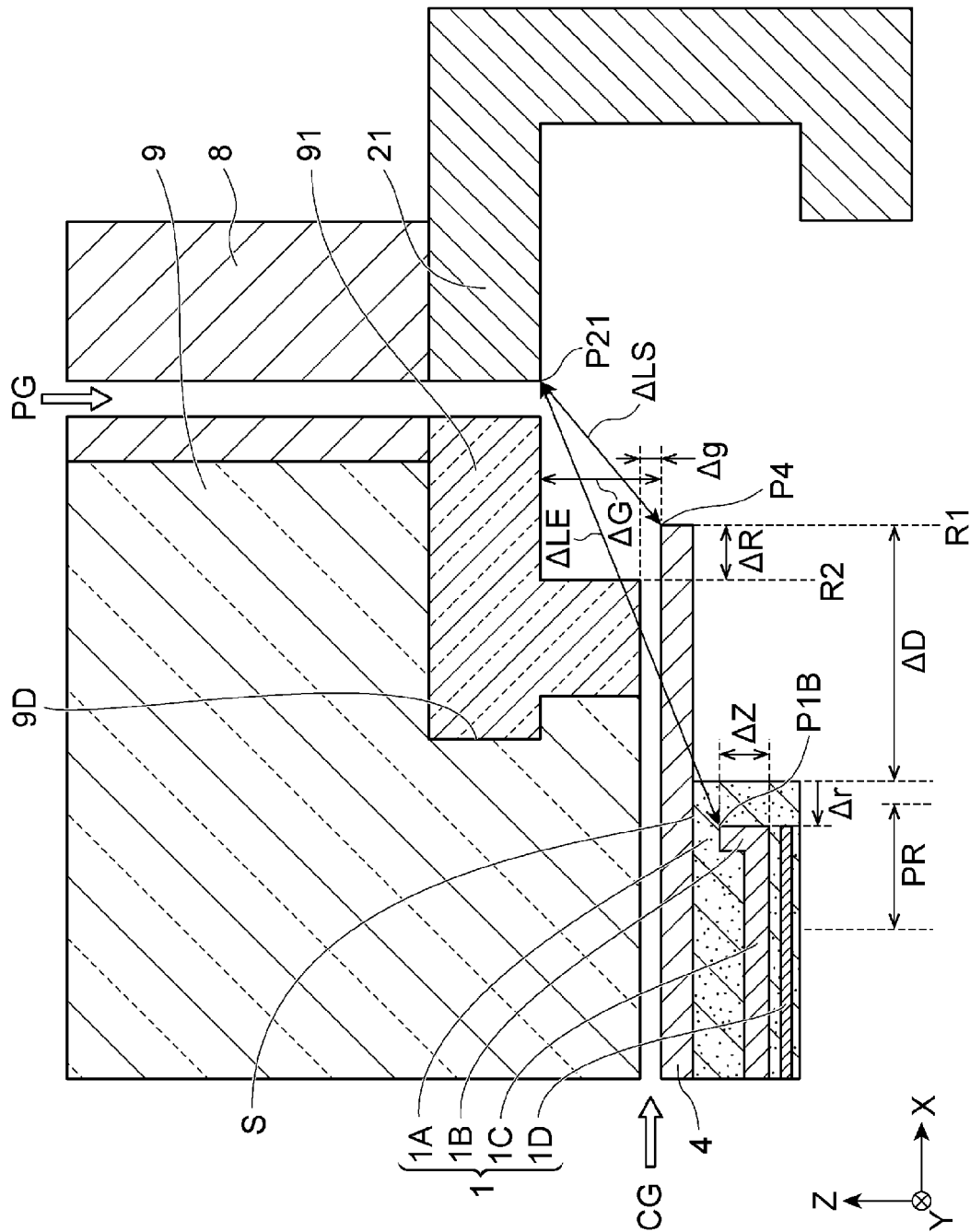
FIG. 2 is an enlarged cross-sectional view of a region II illustrated in FIG. 1.

FIG. 2 is an enlarged cross-sectional view of the region II illustrated in FIG. 1.

The gap $\Delta g$ is the dimension of the gap between the surface of the substrate 4 and the lower surface of the lower end of the first insulating member 9. The lower surface of the lower end of the first insulating member 9 and the lower surface of the lower end of the ring component 91 are flush with each other. Accordingly, the gap $\Delta g$ is also the dimension of the gap between the surface of the substrate 4 and the bottom surface of the lower end of the ring component 91. The first gas CG introduced from the through hole provided at the center of the first insulating member 9 flows along the surface of the substrate 4 toward the edge of the substrate in the space defined by the gap $\Delta g$. The preferable range of the gap $\Delta g$ is described below.

0.3 mm≤$\Delta g$≤0.6 mm

General plasma is generated when an appropriate electric field is applied to a gas having a pressure of 0.1 Pa to 100 Pa. Further, a sufficient space is necessary for generating plasma. Accordingly, plasma is not generated under an environment where the pressure is relatively high, no electric field is applied, and a sufficient space does not exist. When the gap $\Delta g$ is relatively narrow, the pressure in the narrow space becomes higher than that near the edge of the substrate, and even the electric field is less likely to be applied, so that plasma is hardly generated at the center of the stage 1. When the gap $\Delta g$=0.3 mm, 0.4 mm, 0.5 mm or 0.6 mm, the simulation analysis represents the electric field intensity which does not substantially generate plasma in the region directly above the stage 1 [electric field intensity: Nearly Zero to Low (see, e.g., FIG. 4)]. When $\Delta g$=0.7 mm, it is confirmed that the electric field intensity slightly increases in the region directly above the stage. While plasma may be selectively generated near the edge of the substrate even when the gap $\Delta g$ is 0.7 mm or more, 0.6 mm or less is preferable.

As described above, when the gap $\Delta g$ exceeds the upper limit value, plasma may be easily generated, and when the gap is smaller than the lower limit value, the gas flow is impeded. Accordingly, when the gap $\Delta g$ satisfies the relational expression described above, plasma is hardly generated in regions of the substrate other than the vicinity of the edge thereof within the gap, and the gas flow becomes smooth in the gap.

Figure 6:
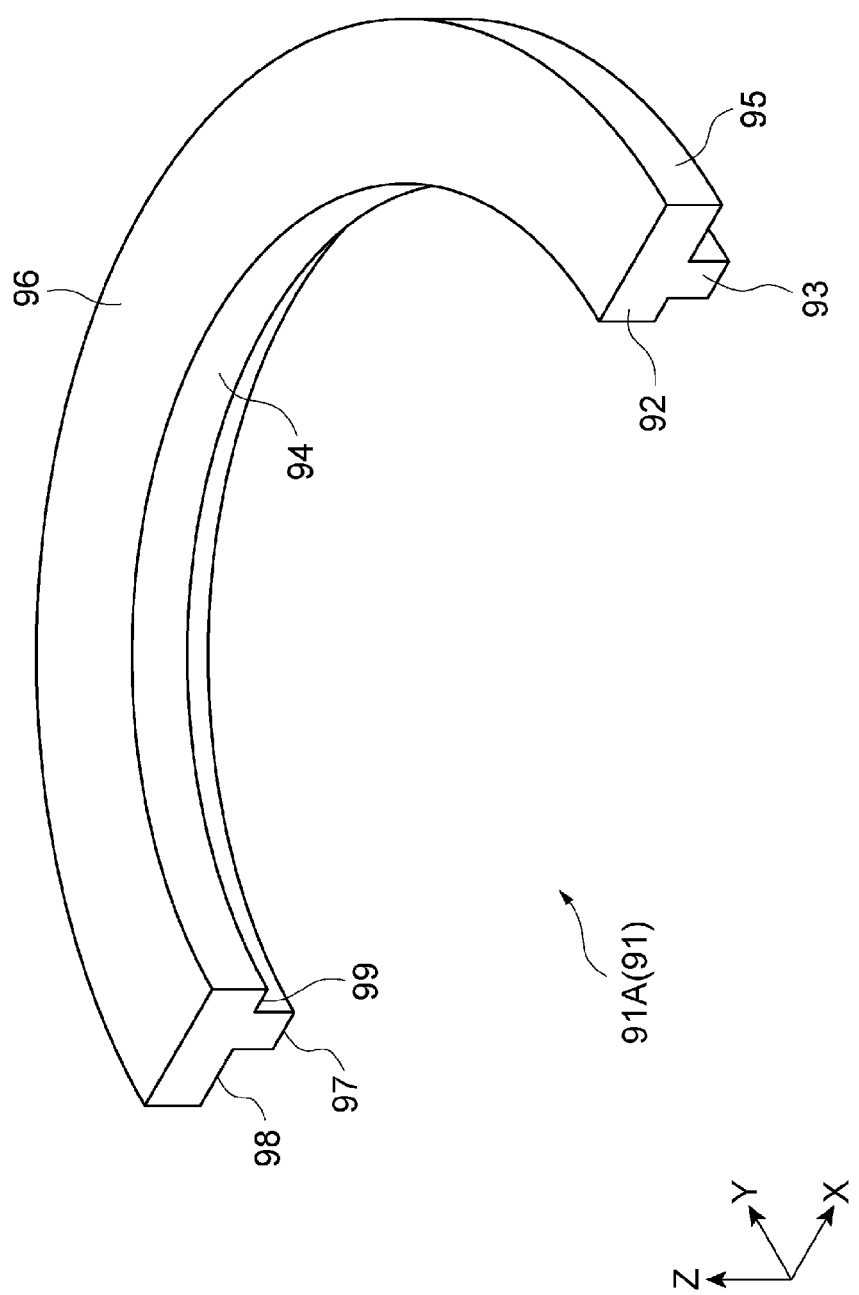
FIG. 6 is a perspective view of an arc-shaped component that makes up a ring component.

The second gap $\Delta G$ is the dimension of the gap between the surface of the substrate 4 about 1 mm inside from the edge of the substrate 4 and the lower surface 98 of an upper ring of the ring component 91 (see, e.g., FIG. 6). The preferable range of the second gap $\Delta G$ is described below.

$\Delta g$<$\Delta G$

More preferably, $\Delta g$+20 mm≤$\Delta G$. That is, a sufficient space for generating plasma near the edge of the substrate is provided, so that plasma is easily generated.

Figure 4:
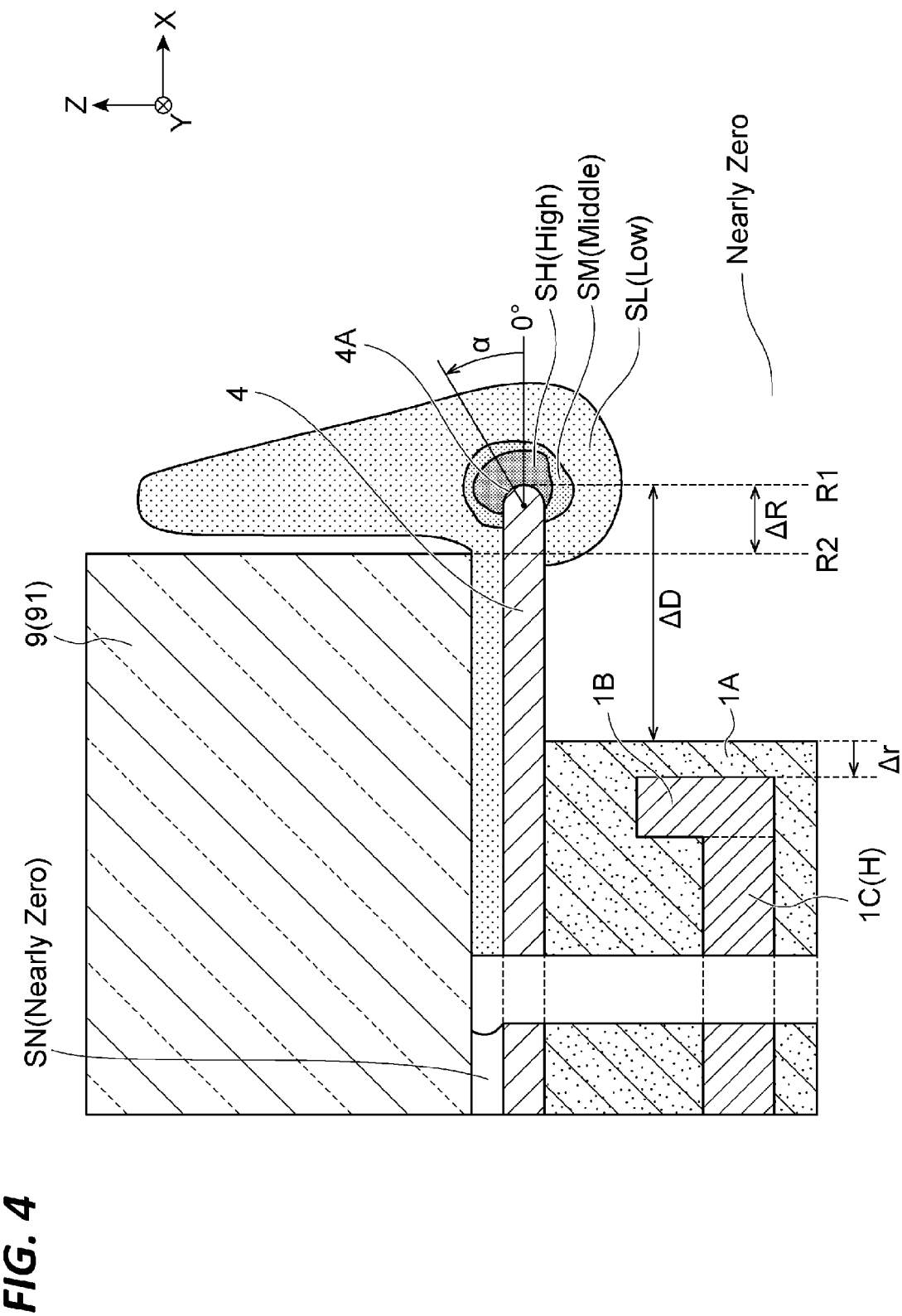
FIG. 4 is a view illustrating a plasma distribution around an edge of a substrate.

The maximum diameter DMmax of the placement surface S is smaller than the maximum diameter DSmax of the substrate 4 placed on the placement surface S. FIG. 2 represents that the distance $\Delta D$=(DSmax−DMmax)/2. The shortest horizontal distance from the peripheral edge of the substrate 4 to the peripheral edge of the stage 1 is equal to the distance $\Delta D$. While FIG. 2 represents that the peripheral edge of the substrate 4 has a vertical plane, the edge is inclined (bevel edge) in many cases as illustrated in FIG. 4, and the substrate 4 to which deposits adhere may be a processing target as described above.

In the plasma processing apparatus 100, the dimension of the substrate 4 which is a processing target is preset by an apparatus specification. For example, when an 8-inch wafer (a diameter of 200 mm, a thickness of 725 μm) is processed, DSmax corresponds to the diameter of the wafer. When the maximum diameter DMmax of the placement surface S is smaller than the maximum diameter DSmax of the substrate 4 (DMmax<DSmax), the edge of the substrate 4 protrudes from the placement surface S, so that plasma is easily generated near the edge of the substrate 4. When a 12-inch wafer (a diameter of 300 mm, a thickness of 775 μm) is processed, the amount of the lateral protrusion from the edge of the substrate is in issue, and thus, the preferable range of $\Delta D$ is the same. The preferable range of the distance $\Delta D$ is described below.

2 mm≤$\Delta D$≤4 mm

In other words, when the 8-inch wafer is a processing target, the maximum diameter DMax of the stage 1 is 196 mm (200 mm−4 mm) to 192 mm (200 mm−8 mm). When the 12-inch wafer is a processing target, the maximum diameter DMax of the stage 1 is 296 mm (300 mm−4 mm) to 292 mm (300 mm−8 mm).

The vertical cross-sectional shape of the peripheral edge of the substrate 4 (the shape of the ZX cross section that passes through the center of the stage along the radial direction) is a semicircle (see, e.g., FIG. 4). In this structure, the simulation analysis represents that plasma is selectively generated near the edge of the substrate even when $\Delta D$=0 mm Since the vertical cross-sectional shape of the region where the electric field intensity is relatively high [High (see, e.g., FIG. 4)] is substantially distributed at only the upper portion of the semicircle, high-intensity plasma is not generated at the lower portion of the semicircle. The central position of the semicircular edge is defined as the origin, and the angle in the direction that extends horizontally outward from the origin is defined as "a" (=0°). When $\Delta D$=0 mm, the high-intensity electric field is distributed in the range of $0° \leq \alpha \leq 90°$ (see, e.g., FIG. 4).

When $\Delta D$=2 mm, the high-intensity electric field (High) is distributed in the range of $-20° \leq \alpha \leq 90°$ (see, e.g., FIG. 4). When $\Delta D$=3 mm, the high-intensity electric field (High) is distributed in the range of $-40° \leq \alpha \leq 115°$ (see, e.g., FIG. 4). When $\Delta D$=4 mm, the high-intensity electric field (High) is distributed in the range of $-70° \leq \alpha \leq 115°$ (see, e.g., FIG. 4). Considering that a processing is performed while maintaining the in-plane temperature of the substrate 4 uniformly, the dimension in which $\Delta D$ is 5 mm or more which reduces the placement area is not preferable. In order to suppress plasma from reaching the side surface of the stage body 1A, $\Delta D$ may be 3 mm, but from the viewpoint of generating plasma with a relatively high coverage at the edge, $\Delta D$ may be 4 mm.

The dimension $\Delta Z$ of the radio-frequency electrode 1B in the direction of the thickness preferably satisfies $0.05$ mm$\leq \Delta Z \leq 10$ mm. The more preferable range of $\Delta Z$ is 3 mm$\leq \Delta Z \leq 10$ mm. Further, the more preferable range of $\Delta Z$ is 5 mm$\leq \Delta Z \leq 10$ mm. The distance from the upper surface of the stage body 1A to the upper end of the radio-frequency electrode 1B may be 1 mm or more, and in the present example, the distance is 1 mm.

The radio-frequency electrode 1B extends along the direction of the thickness (the Z-axis direction). When the dimension $\Delta Z$ is smaller than the lower limit value, the area that faces the outer electrode is reduced, so that the generation of plasma near the edge of the substrate tends to be suppressed. When the dimension $\Delta Z$ is larger than the upper limit value, there is a problem in that the electric field insufficiently concentrates on the edge of the substrate. This problem is suppressed when the dimension $\Delta Z$ satisfies the relational expression described above, so that it becomes easy to selectively generate plasma near the edge of the substrate.

The radio-frequency electrode 1B is disposed at a position not so far from the side surface of the stage 1. That is, the radio-frequency electrode 1B is disposed within the region PR below the outer periphery of the placement surface S. The region PR below the outer periphery of the placement surface S is the region where the distance $\Delta r$ from the peripheral edge of the placement surface S satisfies 1 mm$\leq \Delta r \leq 5$ mm.

Since the radio-frequency electrode 1B is embedded and protected in the stage body 1A, $\Delta r$ is larger than 0. When $\Delta r$ is 1 mm or more, the stage body 1A made of ceramics is not easily scraped even when the stage body 1A is exposed to plasma, so that the ratio-frequency electrode 1B is protected. When $\Delta r$ is 5 mm or less, the radio-frequency electrode 1B is not excessively spaced apart from the side surface of the substrate, so that plasma may be effectively generated near the edge of the substrate 4. Further, when $\Delta r$ is 5 mm or less, the influence of the electric field change caused from the ceramics may also be suppressed.

The radial position of the peripheral edge of the substrate 4 placed on the placement surface S of the stage 1 is present outside from the radial position of the peripheral edge of the lower end of the first insulating member 9 (including the ring component 91). Since the edge of the substrate 4 is disposed outside the outer edge of the lower end of the first insulating member 9 (the ring component 91), the edge of the substrate 4 protrudes from the first insulating member 9 (the ring component 91). Accordingly, the sufficient space of the second gap $\Delta G$ is formed near and above the edge of the substrate 4, so that plasma is easily generated.

The difference $\Delta R$ between the radial position R1 of the peripheral edge of the substrate 4 and the radial position R2 of the peripheral edge of the lower end of the first insulating member 9 (including the ring component 91) satisfies 0.5 mm$\leq \Delta R \leq 3$ mm, so that plasma is easily appropriately generated near the edge of the substrate.

In the structure of FIG. 2, for example, $\Delta g$=0.4 mm, $\Delta r$=2 mm, $\Delta D$=3 mm, $\Delta R$=2 mm, $\Delta LS$=15 mm, $\Delta G$=9 mm, and $\Delta LE$=19 mm Here, $\Delta LS$ refers to the shortest distance between the edge of the substrate 4 and the exhaust ring 21 (the outer electrode). $\Delta LE$ refers to the shortest distance between the radio-frequency electrode 1B and the exhaust ring 21 (the outer electrode). The preferable ranges of the distances $\Delta LS$ and $\Delta LE$ are described below.

10 mm$\leq \Delta LS \leq 100$ mm 13 mm$\leq \Delta LE \leq 103$ mm

It is confirmed that when the distance $\Delta LS$ from the edge of the substrate 4 on which plasma is desired to be generated to the position P21 of the exhaust ring 21 that imparts the shortest distance is smaller than the lower limit value, the energy of plasma flows near the exhaust ring 21. Accordingly, it may become difficult to generate plasma only at the edge of the substrate. Thus, the distance $\Delta LS$ is preferably equal to or larger than the lower limit value, and in this case, plasma may be selectively generated only at the edge of the substrate. When the distance $\Delta LS$ exceeds the upper limit value, it may become difficult to generate plasma at the edge of the substrate. When the distance $\Delta LS$ is infinite, plasma is not generated, and thus, the upper limit value is preferably 100 mm or less in order to generate plasma.

The radio-frequency electrode 1B is disposed ($\Delta D + \Delta r$) apart from the edge of the substrate. Since the preferable range of $\Delta D$ is 2 mm to 4 mm and the preferable range of $\Delta r$ is 1 mm$\leq \Delta r \leq 5$ mm, the range of the sum of $\Delta D$ and $\Delta r$ is 3 mm to 9 mm. Accordingly, $\Delta LE$ is preferably $\Delta LS + 3$ mm or more. Thus, it is preferable that the range described above is satisfied. It is more preferable that $\Delta LS + 3$ mm$\leq \Delta LE \leq \Delta LS + 9$ mm is satisfied. Further, $\Delta LS + 2$ mm$\leq \Delta LE \leq \Delta LS + 8$ mm may be satisfied.

A passage is formed between the innermost end of the exhaust ring 21 and the ring component 91, to introduce the second gas PG. In the upper electrode 8, a through hole is provided to communicate with the passage. A plurality of through holes may be provided in the upper electrode 8 to cause the second gas PG to pass through the through holes. The second gas PG introduced from the through hole of the upper electrode 8 passes through the passage outside the ring component 91, and reaches the inside of the exhaust ring 21, that is, the edge of the substrate 4. Further, the introduction route of the second gas PG may be set to another route.

Next, the structure of the radio-frequency electrode 1B will be described in more detail.

Figure 3:
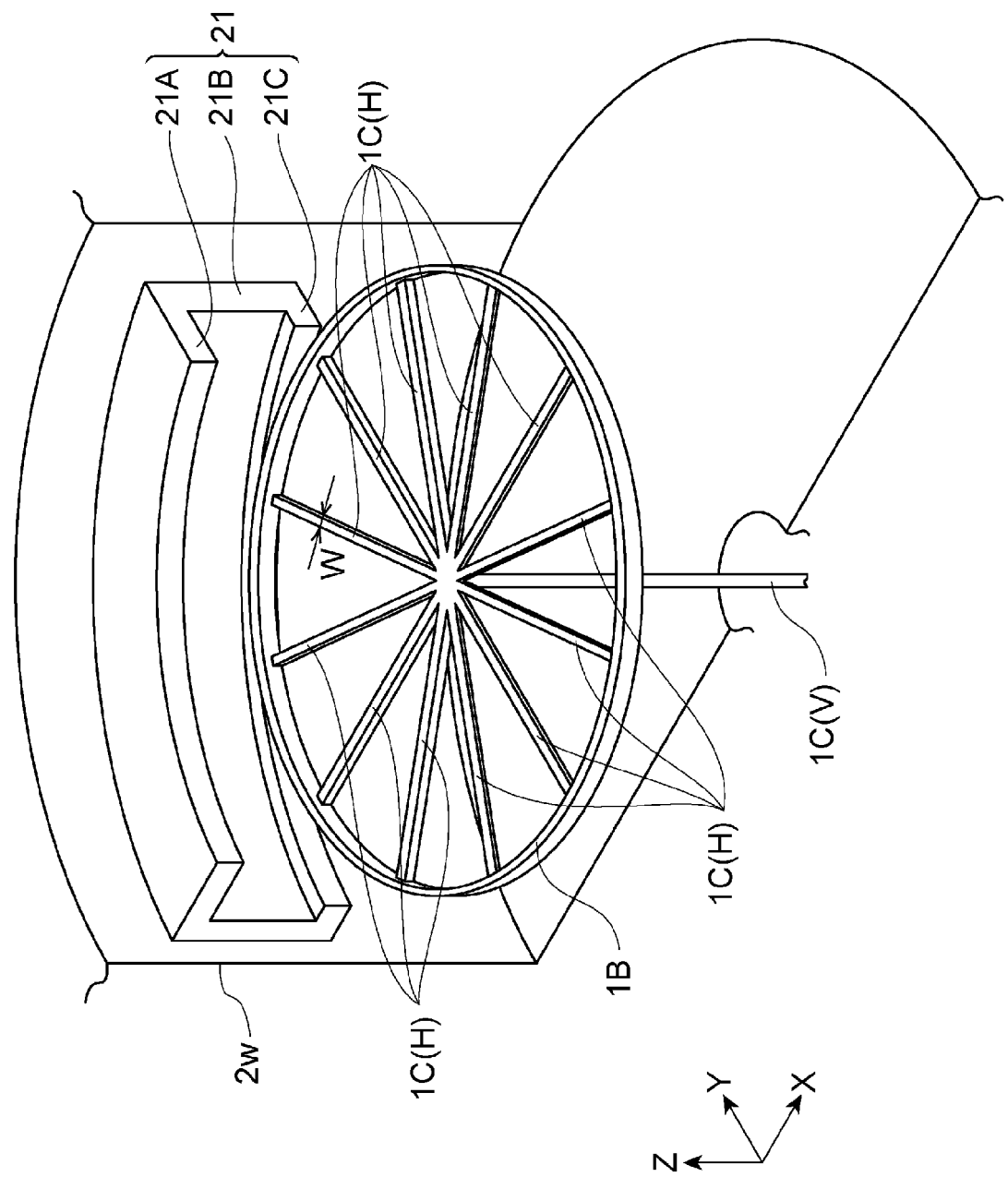
FIG. 3 is a perspective view illustrating a radio-frequency electrode in the plasma processing apparatus illustrated in FIG. 1.

FIG. 3 is a perspective view illustrating the radio-frequency electrode in the plasma processing apparatus illustrated in FIG. 1.

The stage 1 includes the plurality of transmission lines 1C [the horizontal wirings 1C(H)]. In FIG. 3, the number of horizontal wirings 1C(H) is 12, and arbitrary two adjacent horizontal wirings 1C(H) form an angle of 30°. The horizontal wirings 1C(H) transmit a power to the ring-shaped radio-frequency electrode 1B. While the number of horizontal wirings 1C(H) may be one, the number of horizontal wirings 1C(H) is preferably three or more in order to impart a bias uniformly in the circumferential direction. Each transmission line 1C [each horizontal wiring 1C(H)] is a thin film, and the width W thereof satisfies 0.5 mm≤W≤5 mm. The width W is the dimension in the direction perpendicular to the radial direction in the horizontal plane (the XY plane).

The plurality of horizontal wirings 1C(H) extend radially from the substantially central position of the stage 1 (the position of the center of gravity of the stage 1 in the XY plane) toward the radio-frequency electrode 1B, and are connected to the radio-frequency electrode 1B. The radio-frequency electrode 1B positioned in the region PR below the outer periphery of the placement surface S (see, e.g., FIG. 2) contributes to the generation of plasma near the edge of the substrate 4. The transmission lines 1C supplies a radio frequency to the radio-frequency electrode 1B. Assuming that the position of the center of gravity in the plane shape of the stage 1 is the center of the stage, the inner conductor 1C(V) which is a vertical wiring is connected to the portion of the horizontal wirings 1C(H) positioned at the substantially central position of the stage. The substantially central position of the stage refers to a position within a region from the center of the stage to 10% or less of the maximum diameter of the stage. The inner conductor 1C(V) penetrates the bottom surface of the processing container 2 and extends outward.

When the width W is smaller than the lower limit value, the resistance value largely increases, and a power loss occurs. When the width W is larger than the upper limit value, plasma may be widely generated on the substrate by the electric field generated above the transmission lines 1C [the horizontal wirings 1C(H)]. In order to selectively generate plasma only near the edge of the substrate, the generation of plasma above the horizontal wirings 1C(H) may not be preferable. This problem is suppressed when 0.5 mm≤W≤5 mm is satisfied, so that plasma may be selectively generated near the edge of the substrate. From the viewpoint of suppressing the generation of plasma, gaps preferably exist among the plurality of transmission lines C [the horizontal wirings 1C(H)].

The planar shape of the radio-frequency electrode 1B (the shape in the XY plane when viewed from the Z-axis direction) includes a ring shape. In this case, plasma may be generated continuously in a ring shape around the ring-shaped radio-frequency electrode 1B. When the planar shape of the substrate is circular, annular plasma may be generated along the edge of the substrate.

Since the radio-frequency electrode 1B has the portion that extends along the Z-axis direction, a suitable three-dimensional shape thereof is a tubular shape. The height of the tubular shape is ΔZ described above, and in the tubular shape, ΔZ is larger than the thickness of the horizontal wirings 1C(H) in the Z-axis direction. The radial thickness of the radio-frequency electrode 1B may be the same as the thickness of the horizontal wirings 1C(H) in the Z-axis direction. This thickness is, for example, 0.5 mm to 1 mm.

The exhaust ring 21 is provided around the radio-frequency electrode 1B. The exhaust ring 21 includes an upper conductor ring 21A, a middle conductor ring 21B, and a lower conductor ring 21C which are integrated with each other. The upper conductor ring 21A has an annular plate shape, and the radial dimension thereof correlates with ΔLS described above. The middle conductor ring 21B has a tubular shape. The lower conductor ring 21C has an annular plate shape, and the radial dimension thereof is smaller than the radial dimension of the upper conductor ring 21A. Accordingly, the upper conductor ring 21A is positioned closest to the radio-frequency electrode 1B.

The middle conductor ring 21B of the exhaust ring 21 is fixed and electrically connected to the inner wall surface $2w$ of the processing container 2. The processing container 2 is fixed to the ground potential, and the potential of the exhaust ring 21 also has the ground potential. Further, the middle conductor ring 21B is disposed apart from the center of the stage, and positioned on the horizontal extension line of the radio-frequency electrode 1B. In other words, the exhaust ring 21 has the shape in which an intensive electric field is hardly generated between the middle conductor ring 21B and the radio-frequency electrode 1B. That is, the exhaust ring 21 has the structure in which an intensive electric field is formed between the substrate placed above the radio-frequency electrode 1B and the upper conductor ring 21A disposed above the middle conductor ring 21B. Further, the radial length of the lower conductor ring 21C is relatively short. Accordingly, the exhaust ring 21 has the exhausting function when the exhaust ring 21 is connected to the exhaust device, and has the shape in which an intensive electric field is selectively generated near the edge of the substrate on the upper surface of the substrate. This structure is effective for etching deposits, since deposits are mainly deposited on the upper surface of the substrate.

Even when the exhaust ring 21 does not include the lower conductor ring 21C, plasma may be generated at the edge of the substrate. This is because the upper conductor ring 21A mainly contributes to the generation of plasma.

FIG. 4 is a view illustrating a plasma distribution around the edge of the substrate. FIG. 4 represents the vertical cross-sectional structure that passes through the center of gravity of the stage along the radial direction.

It is assumed that deposits 4A formed by the FCVD method or the like adhere to the peripheral edge of the substrate 4. When a radio-frequency displacement is applied to the radio-frequency electrode 1B, an alternating electric field is formed in the space between the radio-frequency electrode 1B and the exhaust ring disposed outside the edge of the substrate. Plasma is generated near the edge of the substrate that protrudes within the alternating electric field.

In the processing container, the region where the highest electric field is generated is defined as a high electric field region SH(High). Exactly, the region that has the electric field intensity of 90% or more of the highest electric field is defined as the high electric field region SH(High). A region that has the electric field intensity of less than 90% and 50% or more of the highest electric field is defined as a middle electric field region SM(Middle). A region that has the electric field intensity of less than 50% and 10% or more of the highest electric field is defined as a low electric field region SL(Low). A region that has the electric field intensity of less than 10% of the highest electric field is defined as a nearly zero electric field region SN(Nearly Zero).

The high electric field region SH(High) is formed near the edge of the substrate, the middle electric field region SM(Middle) is formed around the high electric field region SH(High), and the low electric field region SL(Low) is formed outside the middle electric field region SM(Middle). The nearly zero electric field SN(Nearly Zero) is formed outside the low electric field region SL(Low). Since the electric field concentrates on the edge of the substrate, the electric field intensity sharply decreases as the distance from the edge of the substrate increases. For example, the electric field intensity becomes substantially zero (Nearly Zero) even in the region slightly distant downward from the edge of the substrate. Since the upper conductor ring 21A of the exhaust ring exists at the position higher than the substrate 4, the electric field intensity in the region above the substrate 4 tends to be higher than that in the region below the substrate 4. The cross-sectional area of the high electric field region SH(High) in the vertical cross section of FIG. 4 is smaller than the cross-sectional area of the low electric field region SL(Low). The low electric field region SL(Low) extends from the edge of the substrate 4 toward the center of the substrate 4 on the upper surface of the substrate 4.

In order to remove the deposits 4A that adhere to the edge of the substrate by the plasma etching, it is preferable that the high-intensity electric field is generated to vertically surround the edge of the substrate in the vertical cross section. Further, since it is preferable that unnecessary plasma is not generated at a position apart from the edge of the substrate, the electric field intensity is preferably low at the position, and preferably nearly zero at the position. The nearly zero electric field region SN(Nearly Zero) is formed in the space within the gap above the substrate 4 at the center of the stage. While the factors that generate the electric field include the radio-frequency electrode 1B and the horizontal wirings 1C(H), the radio-frequency electrode 1B extends along the Z-axis direction at the periphery of the substrate, and the horizontal wirings 1C(H) are spaced apart from the upper surface of the stage body 1A. Further, the first insulating member 9 is disposed above the stage body 1A. Accordingly, there exist few factors that affect the electric field in the space on the substrate 4 above the vicinity of the center of the stage, so that the electric field becomes substantially zero.

By using the angle "a" described above, it is evaluated whether plasma in the high electric field region SH(High) may cover the periphery of the edge of the substrate. The preferable range of ΔD which is the amount of the horizontal protrusion of the lower surface of the substrate 4 from the stage 1 is 2 mm≤ΔD≤4 mm as described above.

Meanwhile, the difference ΔR which is the amount of the horizontal protrusion of the upper surface of the substrate 4 from the insulating member is preferably 0.5 mm≤ΔR≤3 mm, which implements the structure in which plasma is easily appropriately generated near the edge of the substrate. When the difference ΔR exceeds the upper limit value, plasma is easily generated in the region closer to the center of the substrate than the edge of the substrate, and when the difference ΔR is smaller than the lower limit value, the generation of plasma near the edge of the substrate is suppressed. Accordingly, when ΔR satisfies the relational expression described above, plasma is hardly generated in regions of the substrate other than the vicinity of the edge thereof, and may be easily selectively generated near the edge of the substrate.

Figure 5:
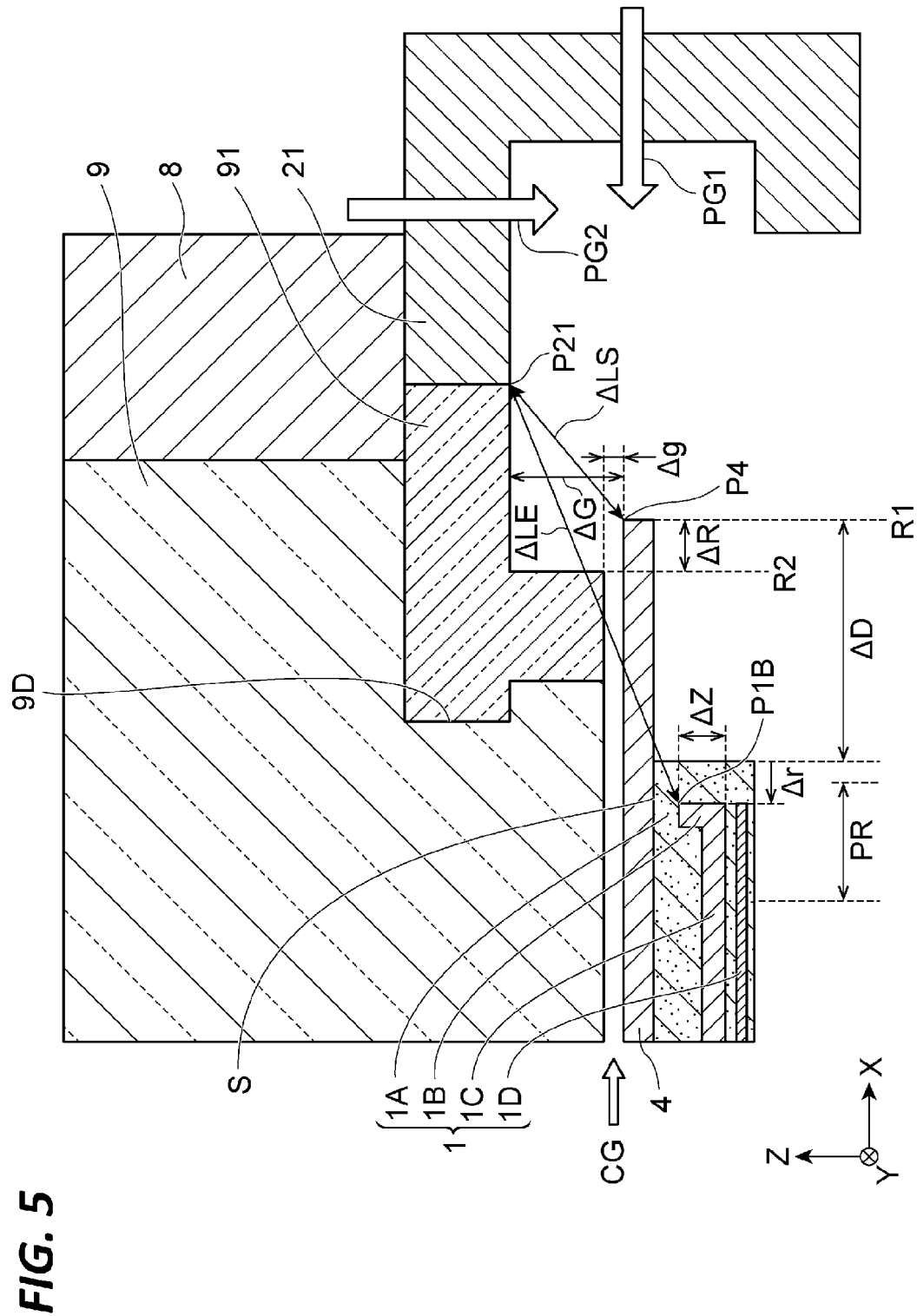
FIG. 5 is a vertical cross-sectional view of a region including an edge of a substrate in a plasma processing apparatus according to another embodiment.

FIG. 5 is a vertical cross-sectional view of the region that includes the edge of the substrate in a plasma processing apparatus according to another embodiment.

The supply positions of the gas supplied from the gas source are the center and the periphery of the processing container 2. In FIG. 2, the second gas for the supply from the periphery is supplied from the inner position than the exhaust ring 21. The supply position of the second gas may be the position of the exhaust ring 21. That is, a through hole for the supply of a gas may be provided in the middle conductor ring of the exhaust ring 21, and the second gas (a first peripheral gas PG1) may be supplied from the through hole. Further, a through hole for the supply of a gas may be provided in the upper conductor ring of the exhaust ring 21, and the second gas (a second peripheral gas PG2) may be supplied from the through hole. In this structure, a gap may not be provided between the exhaust ring 21 and the ring component 91, and the innermost end of the upper conductor ring of the exhaust ring 21 and the outer end of the upper ring of the ring component 91 may be brought into contact with each other.

FIG. 6 is a perspective view of an arc-shaped component that makes up the ring component 91.

The plasma processing apparatus described above generates plasma near the peripheral edge of the substrate. The replaceable ring component 91 disposed near the edge of the substrate deteriorates when the ring component 91 is used for a long time. The ring component 91 includes split-type insulating members, and each insulating member is an arc-shaped component 91A. The arc-shaped component 91A has a shape in which an upper ring 92 with a relatively wide width and a lower ring 93 with a relatively narrow width are integrated with each other. The upper ring 92 is made of an annular insulator.

The portion of the upper ring 92 which is disposed inside the lower ring 93 fits into the lower lateral recess 9D of the first insulating member 9 illustrated in FIG. 2. The lateral recess 9D extends radially from the outer peripheral side surface of the first insulating member 9 toward the central axis of the first insulating member 9. The lateral recess 9D makes up a groove that extends circumferentially to surround the vertical central axis of the first insulating member 9. The inner side surface 94 of the upper ring 92 faces the deepest portion of the lateral recess 9D of the first insulating member 9. The upper surface 96 of the upper ring 92 comes into contact with the surface of the lateral recess 9D that serves as the lower surface of the first insulating member 9, among the surfaces of the lateral recess 9D. The inner lower surface 99 of the upper ring 92 comes into contact with the surface of the lateral recess 9D that serves as the upper surface of the first insulating member 9, among the surfaces of the lateral recess 9D. The outer lower surface 98 of the upper ring 92 is positioned above the edge of the substrate. The lower surface 98 is spaced ΔG apart from the surface of the substrate (see FIG. 2). The outer side surface 95 of the upper ring 92 restricts the position of the exhaust ring. The lower surface 97 of the lower ring 93 faces the substrate 4, and is flush with the lower surface of the lower end of the first insulating member 9. The dimension of the lower ring 93 in the Z-axis direction defines ΔG (see FIG. 2).

The ring component 91 includes a plurality of arc-shaped components 91A. FIG. 6 represents that the opening angle of the arc shape is 180°, and one ring component 91 includes two arc-shaped components 91A. The ring component 91 may have a shape that may be divided into three or more components 91A.

Figure 7:
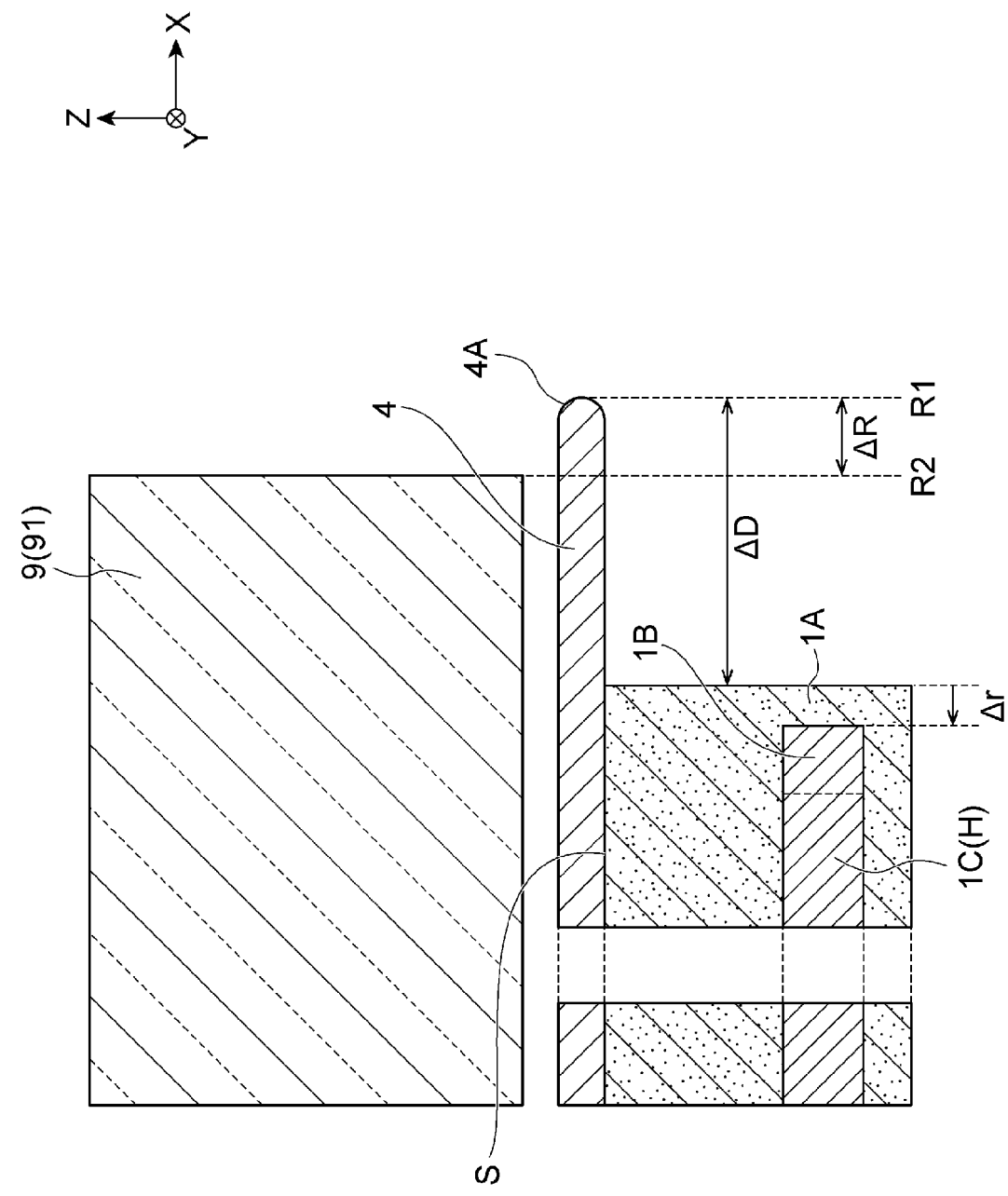
FIG. 7 is a view illustrating a vertical cross-sectional configuration of a plasma processing apparatus according to yet another embodiment.

FIG. 7 is a view illustrating a vertical cross-sectional configuration of a plasma processing apparatus according to another embodiment.

The plasma processing apparatus is a modification of the plasma processing apparatus described with reference to FIGS. 1 to 6, and is different from the plasma processing apparatus described above, only in that the radio-frequency electrode 1B does not extend in the Z-axis direction. The plasma processing apparatus includes the stage 1, the processing container 2 that accommodates the stage 1, and the gas source 3 for the generation of plasma in the processing container 2, as illustrated in FIG. 1. The stage 1 includes the placement surface S, and the stage body 1A in which the radio-frequency electrode 1B is embedded. The stage body 1A is made of ceramics, and the radio-frequency electrode 1B is disposed in the region below the outer periphery of the placement surface S. The maximum diameter DMmax of the placement surface S is smaller than the maximum diameter DSmax of the substrate 4 placed on the placement surface S (DSmax>DMmax). That is, ΔD=(DSmax−DMmax)/2>0.

An exhaust ring (an outer electrode) may be disposed outside the periphery of the substrate 4. When a radio-frequency voltage is applied between the radio-frequency electrode 1B disposed in the region below the outer periphery of the placement surface S and the exhaust ring, plasma is easily generated near the peripheral edge of the substrate 4. Since the maximum diameter DMmax of the placement surface S is smaller than the maximum diameter DSmax of the substrate 4, the edge of the substrate 4 protrudes from the placement surface S, so that plasma is easily generated near the edge of the substrate 4. When plasma is generated under a gas atmosphere suitable for an etching, the deposits 4A that adhere to the edge of the substrate 4 may be efficiently etched. Since the radio-frequency electrode 1B is embedded in the ceramics, the radio-frequency electrode 1B is protected without being exposed to the plasma.

The simulation described above was conducted using the HFSS (registered trademark: radio-frequency electromagnetic field simulation software by the finite element method of Ansoft). The planar shape of each of the placement surface of the substrate 4 and the stage 1 is circular, and the reference values of the conditions for the simulation are described below. The following parameters were used unless otherwise specified, and the parameters were individually changed according to conditions.

(Substrate 4)
Material of substrate 4: Si
Diameter DSmax of substrate 4: 300 mm
Thickness of substrate 4: 775 μm
(Stage Body 1A)
Material of stage body 1A: AlN
(Radio-Frequency Electrode 1B)
Material of radio-frequency electrode 1B: W
Diameter of radio-frequency electrode 1B: 290 mm
Thickness of radio-frequency electrode 1B: 1 mm
Dimension ΔZ of radio-frequency electrode 1B: 7 mm
[Each Horizontal Wiring 1C(H)]
Material for horizontal wiring 1C(H): W
Diameter of horizontal wiring 1C(H): 289 mm
Thickness of horizontal wiring 1C(H): 1 mm
[Inner Conductor 1C(V)]
Material of inner conductor 1C(V): W
Diameter of inner conductor 1C(V): 3 mm
Length of inner conductor 1C(V) in Z-axis direction: 100 mm
(Outer Conductor 1E)
Material of outer conductor 1E: Al
Diameter of outer conductor 1E: 10 mm
Length of outer conductor 1E in Z-axis direction: 100 mm
[First Insulating Member 9 (Main Body)]
Material of first insulating member 9: quartz ($SiO_2$)
Diameter of first insulating member 9: 302 mm
Thickness of first insulating member 9: 80 mm
(Ring Component 91)
Material of ring component 91: quartz ($SiO_2$)
Δg: 0.5 mm
ΔG: 9 mm
ΔR: 2 mm
(Exhaust Ring 21)
Material of exhaust ring 21: Al
Radial dimension of upper conductor ring 21A of exhaust ring 21: 45 mm
Radial dimension of middle conductor ring 21B of exhaust ring 21: 15 mm
Radial dimension of lower conductor ring 21C of exhaust ring 21: 20 mm
Dimension of exhaust ring 21 in Z-axis direction: 40 mm
ΔLS: 15 mm
ΔLE: 21 mm
(Radio-Frequency Power Supply 6)
Frequency of radio-frequency power for generating plasma: 13.56 MHz The plasma processing method according to the embodiment described above includes placing the substrate 4 on the stage 1, and supplying a gas from the gas source 3 into the processing container 2, using any one of the plasma processing apparatuses described above. Further, the plasma processing method includes supplying a radio-frequency power to the radio-frequency electrode 1B, and selectively generating plasma near the peripheral edge of the substrate 4. Since plasma is selectively generated near the peripheral edge of the substrate 4, the edge of the substrate may be efficiently processed with plasma, without exposing the other portions of the substrate to plasma.

The above-described plasma processing apparatus and plasma processing method are usable for etching deposits formed on the edge of the substrate in a CVD film forming apparatus. The deposits cause a contamination through an exfoliation or the like. By removing the deposits, the contamination may be prevented during the transfer of the substrate. Further, since the above-described plasma processing apparatus and plasma processing method include the heater electrode layer, the apparatus and method may anneal the substrate, in addition to removing the deposits deposited on the bevel of the substrate, in a single apparatus. When the structure or dimension of the heater electrode layer is optimized, both the uniformity of the temperature of the substrate and the performance of the etching of the bevel may be improved. For example, after the FCVD is performed, the etching of the bevel may be performed, and then, the annealing may be performed. Further, the etching of the bevel may be performed while performing the annealing.

As a plasma generating mechanism, a capacitively coupled (CCP) plasma generating mechanism may be used. When a radio-frequency voltage is applied between the radio-frequency electrode 1B and the exhaust ring 21 (the outer electrode), it may be conceived to apply a radio-frequency potential of which potential fluctuates, to the outer electrode. Further, a radio frequency may be applied to both the electrodes, and it may be conceived to apply a DC potential thereto as necessary. While the second insulating member 10 is disposed below the stage 1, the shape of the second insulating member 10 is a hollow tubular shape. The second insulating member 10 may have a shape that fills the entire region below the stage 1. The direction of the radio-frequency electrode 1B that extends along the Z-axis direction may not be completely vertical. That is, even when the radio-frequency electrode 1B is inclined radially or circumferentially, plasma may be generated near the edge of the substrate according to the principle that has been described. As the substrate that is a processing target, in addition to a circular wafer, a polygonal substrate that includes a quadrangle or more may be used.

According to the stage, the plasma processing apparatus, and the plasma processing method disclosed in an embodiment, plasma may be efficiently generated near the edge of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A stage comprising:
a stage body having a placement surface;
a radio-frequency electrode embedded in a region below an outer periphery of the placement surface of the stage body; and
a plurality of transmission lines connected to the radio-frequency electrode,
wherein the stage body is made of ceramics, and
the radio-frequency electrode extends in a thickness direction of the stage body and has a thickness thicker than that of each of the plurality of transmission lines.

2. The stage according to claim 1,
wherein the plurality of transmission lines are connected from a substantially central position of the stage to the radio-frequency electrode,
each of the transmission lines is a thin film having a width W, and
the width W is in a range of $0.5 \text{ mm} \leq W \leq 5 \text{ mm}$.

3. The stage according to claim 1, wherein a maximum diameter of the placement surface is smaller than a maximum diameter of a substrate to be placed on the placement surface.

4. The stage according to claim 1, wherein a heater electrode layer is provided inside the stage body.

5. The stage according to claim 1, wherein a dimension $\Delta Z$ of the radio-frequency electrode in the thickness direction is in a range of $0.05 \text{ mm} \leq \Delta Z \leq 10 \text{ mm}$.

6. The stage according to claim 1, wherein a distance $\Delta r$ between the region below the outer periphery of the placement surface and a peripheral edge of the placement surface is in a range of $1 \text{ mm} \leq \Delta r \leq 5 \text{ mm}$.

7. The stage according to claim 1, wherein a planar shape of the radio-frequency electrode includes a ring shape.

8. A plasma processing apparatus comprising:
the stage according to claim 1;
a processing container configured to accommodate the stage; and
a gas source configured to supply a gas for generating plasma in the processing container.

9. The plasma processing apparatus according to claim 8, wherein a gas is supplied from the gas source into a center and a periphery of the processing container.

10. The plasma processing apparatus according to claim 8, further comprising:
an insulator disposed above the substrate placed on the placement surface of the stage via a gap $\Delta g$.

11. The plasma processing apparatus according to claim 10, wherein the gap $\Delta g$ is in a range of $0.3 \text{ mm} \leq \Delta g \leq 0.6 \text{ mm}$.

12. The plasma processing apparatus according to claim 10, wherein a radial position of a peripheral edge of the substrate placed on the placement surface of the stage is present outside a radial position of a peripheral edge of a lower end of the insulator.

13. The plasma processing apparatus according to claim 12, wherein a difference $\Delta R$ between the radial position of the peripheral edge of the substrate and the radial position of the peripheral edge of the lower end of the insulator is in a range of $0.5 \text{ mm} \leq \Delta R \leq 3 \text{ mm}$.

14. A plasma processing apparatus comprising:
a processing container configured to perform a plasma processing;
a stage accommodated in the processing container; and
a gas source configured to supply a gas for generating plasma in the processing container,
wherein the stage includes:
a stage body having a placement surface;
a radio-frequency electrode embedded in a region below an outer periphery of the placement surface of the stage body and
a plurality of transmission lines connected to the radio-frequency electrode,
wherein the stage body is made of ceramics,
the radio-frequency electrode extends in a thickness direction of the stage body and has a thickness thicker than that of each of the plurality of transmission lines, and
a maximum diameter of the placement surface is set to be smaller than a maximum diameter of a substrate to be placed on the placement surface.

15. A plasma processing method using the plasma processing apparatus according to claim 8, the plasma processing method comprising:
placing a substrate on the stage;
supplying a gas from the gas source into the processing container;
supplying a radio-frequency power to the radio-frequency electrode to selectively generate plasma near a periphery edge of the substrate.

16. The stage according to claim 7, wherein the end of each of the plurality of transmission lines is connected to an inner periphery of the ring shape radio-frequency electrode.

* * * * *